United States Patent [19]

McCarthy

[11] 4,178,542
[45] Dec. 11, 1979

[54] MONITORING THE OPERATION STATUS OF AN ELECTRICAL COMPONENT ON THE BASIS OF AN INHERENT PULL UP OR PULL DOWN CHARACTERISTIC

[75] Inventor: Charles C. McCarthy, Baltimore, Md.

[73] Assignee: Westinghouse Electric Corp., Pittsburgh, Pa.

[21] Appl. No.: 873,344

[22] Filed: Jan. 30, 1978

[51] Int. Cl.² ............................................ G01R 31/02
[52] U.S. Cl. ...................................... 324/51; 340/653
[58] Field of Search ............ 324/51, 73 R, 133, 28 R, 324/21; 340/505, 514, 515, 644, 653

[56] References Cited

U.S. PATENT DOCUMENTS

| | | | |
|---|---|---|---|
| 3,649,913 | 3/1972 | Flieder et al. | 324/133 |
| 3,689,830 | 9/1972 | Caldwell et al. | 324/51 |
| 3,836,854 | 9/1974 | Wehman | 324/133 |
| 3,973,184 | 8/1976 | Raber | 324/51 |
| 3,991,362 | 11/1976 | Blair et al. | 324/51 |

Primary Examiner—Gerard R. Strecker
Attorney, Agent, or Firm—M. P. Lynch

[57] ABSTRACT

In an electrical or electronic system employing numerous remote devices such as relays, lamps, motors, etc., requiring periodic testing to determine their operability, a monitoring circuit is connected to the output of a test signal generator to provide an indication of the operational integrity of the remote device without requiring a separate dedicated electrical lead for monitoring the operational integrity of the remote device.

2 Claims, 1 Drawing Figure

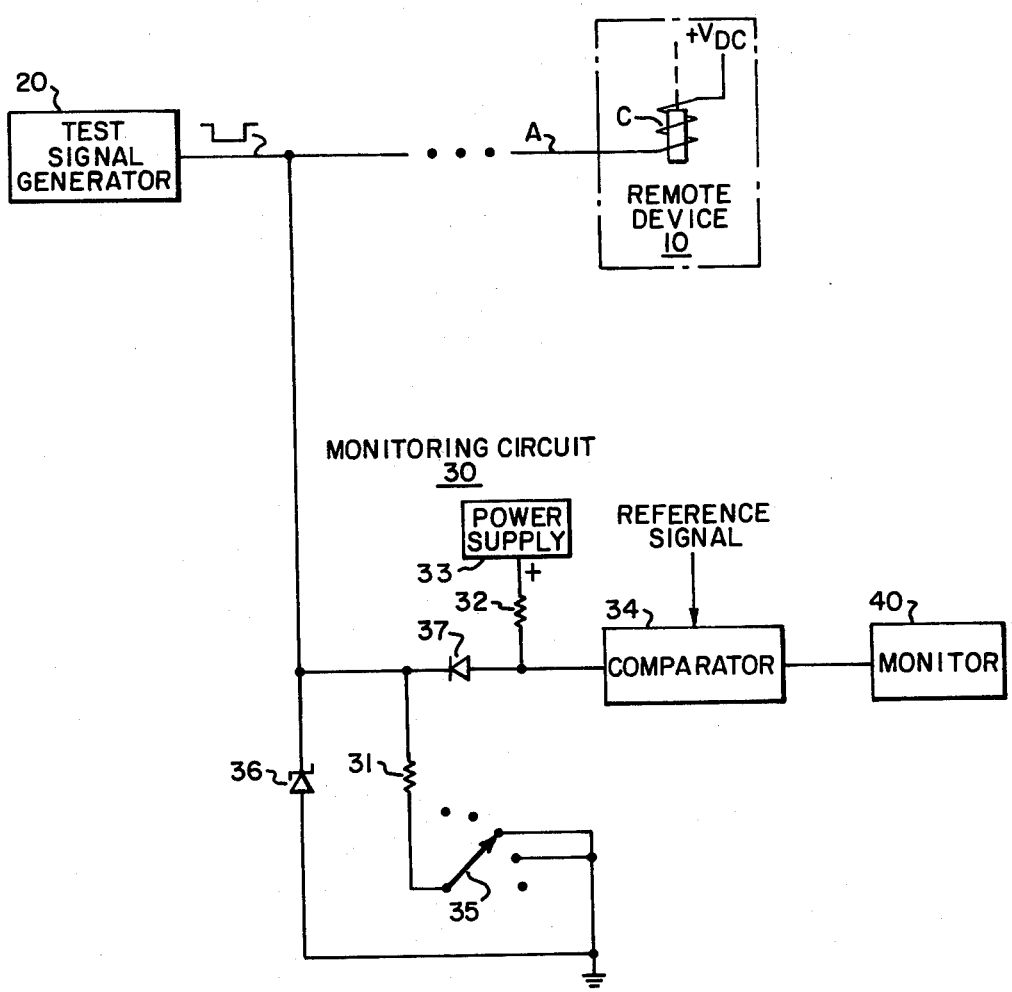

MONITORING THE OPERATION STATUS OF AN ELECTRICAL COMPONENT ON THE BASIS OF AN INHERENT PULL UP OR PULL DOWN CHARACTERISTIC

BACKGROUND OF THE INVENTION

In electronic and electrical systems wherein access to numerous remote monitoring and control devices represents a costly and complex problem, such as encountered in a nuclear reactor facility, the requirement for running dedicated electrical leads to hundreds of remote devices solely for the purpose of monitoring the operational integrity of the remote devices is a major system design and cost consideration.

SUMMARY OF THE INVENTION

There is disclosed herein with reference to the accompanying drawing a technique which eliminates the requirement for a separate dedicated electrical lead associated with each remote device to provide a feedback indication of the operational integrity of the remote device. A monitoring circuit is connected to the output of a test signal generator circuit employed to transmit test conditions to the remote devices. The monitoring circuit employs a combination of resistors with a comparator circuit to monitor a change in the voltage or current condition of the output signals of the test generator as an indication of the operational integrity of the remote devices.

DESCRIPTION OF THE DRAWINGS

The invention will become more readily apparent from the following exemplary description in connection with the blocked diagram schematic illustration of an embodiment of the invention.

DESCRIPTION OF THE PREFERRED EMBODIMENT

The monitoring technique disclosed herein takes advantage of the inherent pull-up of a remote device to verify continuity of the test or activating electrical lead and/or to check open or shorted coils, filaments, etc., as well as the presence of electrical excitation at the remote devices which may typically include, relays, lamps, motors, solenoids, etc.

Referring to the drawing there is typically illustrated a block diagram schematic of a portion of an electrical system consisting of a remote electrical device 10, and a test signal generator 20 having a monitoring circuit 30 operably connected to the output lead of the test generator circuit 20.

The test output signals from test signal generator 20, which for the purpose of discussion are assumed to be voltage signals, may take the form of a pulse or a predetermined steady state voltage level. In the embodiment illustrated, the remote device 10 consists of a relay having a relay coil C connected to a source of DC excitation potential (not shown). The monitoring circuit 30 monitors the output signal of the test signal generator 20 and interrogates this output signal to determine the electrical continuity of electrical lead wire A, the availability of DC excitation potential to the relay coil C and the condition of relay coil C, i.e. open circuit, short circuited, etc.

The monitoring circuit 30 consists essentially of a pull-down resistor 31, a pull-up resistor 32 and a comparator 34. The terms pull-up and pull-down are terms of the art and are defined in numerous publications including, Modern Dictionary of Electronics, by R. F. Graf, 1975. Pull-down resistor 31 and the pull-up resistor 32 are connected between voltage source 33 and ground. The potential developed across the resistors 31 and 32 serve as a first input to comparator circuit 34 with a second input to the comparator circuit 34 being a reference signal. The resistance value of the pull-down resistor 31 is selected to provide a predetermined degree of "pull-down" so that the resulting input voltage signal supplied to the comparator circuit 34, when compared to the reference voltage input, will produce a logic output from the comparator circuit 34 signal indicating the remote device 10 to be operative or inoperative. The reference signal corresponds to a normal operational status. The pull-up resistor 32 functions in a similar manner and is employed to adjust the input voltage signal to the comparator circuit 34 to determine the operational status of remote devices which do not provide inherent pull-up, i.e., a CMOS gate. It is apparent that numerous resistors can be incorporated to provide both the pull-up and pull-down functions and selector switches such as selector switch 35 can be employed to select the proper resistance value or choose between a grounded or ungrounded condition as illustrated in the drawing. In the embodiment illustrated, wherein the remote device 10 consists of a relay, a break in the electrical lead A, an open in the relay coil C or the absence of supply voltage will result in pull-down resistor 31 developing an input to comparator circuit 34 which will produce a logic output indicative of an inoperative remote device. This logic output can be manifested on a visual display circuit 40 or can be employed to implement a control or safety function.

The selection of the pull-up or pull-down mode, depending on the type of remote device involved, is selected by switch 35. The positioning of switch 35 as illustrated in the drawing implements the pull-down mode, while positioning of the switch at an open contact introduces the pull-up resistor 32 which provides an input to the comparator circuit 34, thus illustrating the capability of monitoring circuit 30 to evaluate various loads represented by remote device 10. In the application of the monitoring circuit 30 to a remote device having inherent pull-up, such as a relay, resistor 31 is chosen to provide an input to the comparator circuit 34 running to a logic low if there is a break in the electrical lead A, or if the relay coil C has failed open or lacks the applied excitation voltage. The pull-up resistor 32 on the other hand, is chosen to provide a light pull-up to provide an input the comparator circuit 34 corresponding to a logic high when the monitoring circuit 30 is connected to a remote device 14 lacking the inherent pull-up characteristics. Such devices include CMOS gates, some discrete transistor circuits, etc.

The following table illustrates the operation of the monitoring circuit 40 to determine the operational status (normal or abnormal) of the remote device when subjected to a pulse test signal. It is apparent that the test signal may indeed be a static level rather than a pulse.

| | Anticipated Input To Comparator 34 | Actual Input To Comparator 34 | Comparator 34 Output |
|---|---|---|---|
| Normal | 1 ⎯⏋⎵⎿⎯ 0 | 1 ⎯⏋⎵⎿⎯ 0 | Operative (Normal) |
| Shorted Coil C | 1 ⎯⏋⎵⎿⎯ 0 | 1 ⎯⎯⎯⎯⎯ 0 | Inoperative (Abnormal) |
| Broken Wire A - Open Coil C | 1 ⎯⏋⎵⎿⎯ | 1 ⎯⎯⎯⎯⎯ | Inoperative (Abnormal) |
| Absence of $V_{DC}$ | 0 | 0 | ⎯⎯⎯ |

In the embodiment illustrated, the Zener diode 36 functions to clamp noise spikes while diode 37 isolates high voltage from the input to the comparator circuit 34.

I claim:

1. Apparatus for determining the operational status of an electronic or electrical component which exhibits either an inherent pull-up or pull-down characteristic comprising,
  a test signal generating means including a single electrical lead connecting said test signal generating means to said electrical component, said test signal generating means applying a test signal to said electrical component via said electrical lead, and
  monitoring circuit means connected to said electrical lead to monitor the response of said electrical component to said test signal, said monitoring circuit means including;
    1. a comparator circuit having a first and second input, said first input being connected to said electrical lead,
    2. a pull-up and a pull-down circuit means,
    3. means for selectively connecting either said pull-up or pull-down circuit means depending on the pull-up or pull-down characteristic of said electrical component, to the first input of said comparator circuit means, a predetermined reference signal being supplied to the second input of said comparator circuit means,
  said monitoring circuit means responding to said input by producing an output indication of the operational status of said electrical component.

2. Apparatus for determining the operational status of an electronic or electrical component exhibiting an inherent pull-up or pull-down characteristic comprising,
  a test signal generating means including a single electrical lead connecting said test signal generating means to said electrical component, said test signal generating means supplying a test signal to said electrical component via said electrical lead, and
  monitoring means connected to said electrical lead to monitor the response of said electrical component to said test signal, said monitoring circuit including:
    1. a comparator circuit means having a reference signal indicative of the normal operational status of said electrical component as a first input, said response of said electrical component to said test signal being a second input to said comparator circuit means,
    2. a pull-down resistor connected to said second input of said comparator circuit means,
    3. a pull-up resistor connected between a source of electrical potential and said second input of said comparator circuit means,
    4. switch means for operatively connecting either said pull-up or pull-down resistor to said second input of said comparator circuit means depending on the pull-up or pull-down characteristic of said electrical component,
  said comparator circuit means generating an output indicative of a normal/abnormal operational status of said electrical component.

* * * * *